United States Patent
Kurihara et al.

(10) Patent No.: US 12,222,201 B2
(45) Date of Patent: Feb. 11, 2025

(54) METHOD FOR MEASURING SURFACE PARAMETER OF COPPER FOIL, METHOD FOR SORTING COPPER FOIL, AND METHOD FOR PRODUCING SURFACE-TREATED COPPER FOIL

(71) Applicant: MITSUI MINING & SMELTING CO., LTD., Tokyo (JP)

(72) Inventors: Hiroaki Kurihara, Ageo (JP); Takeshi Iwase, Ageo (JP)

(73) Assignee: MITSUI MINING & SMELTING CO., LTD., Tokyo (JP)

( * ) Notice: Subject to any disclaimer, the term of this patent is extended or adjusted under 35 U.S.C. 154(b) by 0 days.

(21) Appl. No.: 18/714,941

(22) PCT Filed: Dec. 22, 2021

(86) PCT No.: PCT/JP2021/047646
§ 371 (c)(1),
(2) Date: May 30, 2024

(87) PCT Pub. No.: WO2023/119513
PCT Pub. Date: Jun. 29, 2023

(65) Prior Publication Data
US 2024/0328779 A1    Oct. 3, 2024

(51) Int. Cl.
G01B 11/30    (2006.01)
G01B 9/04    (2006.01)
H05K 1/02    (2006.01)

(52) U.S. Cl.
CPC ............... *G01B 11/30* (2013.01); *G01B 9/04* (2013.01); *H05K 1/0237* (2013.01)

(58) Field of Classification Search
CPC ........ G01B 9/04; G01B 11/30; G01B 9/0209; H05K 1/0237
See application file for complete search history.

(56) References Cited

U.S. PATENT DOCUMENTS

| | | |
|---|---|---|
| 2010/0089758 A1 | 4/2010 | Tomonaga et al. |
| 2020/0095701 A1 | 3/2020 | Sung et al. |
| 2020/0248330 A1 | 8/2020 | Lai et al. |

FOREIGN PATENT DOCUMENTS

| | | |
|---|---|---|
| JP | H9-241882 A | 9/1997 |
| JP | 2019-178416 A | 10/2019 |

(Continued)

OTHER PUBLICATIONS

Andrew Townsend, Development of an interlaboratory comparison investigating the generation of areal surface texture data per ISO 25178 from XCT, 2017 (Year: 2017).*

(Continued)

*Primary Examiner* — Maurice C Smith
(74) *Attorney, Agent, or Firm* — GREENBLUM & BERNSTEIN, P.L.C.

(57) ABSTRACT

A method for measuring a surface parameter of copper foil exhibiting high correlation with high frequency characteristics, the method for measuring a surface parameter of copper foil including: (a) acquiring a surface profile on at least one surface of an untreated copper foil; (b) setting a cutoff value for an L filter based on the surface profile; (c) acquiring a surface profile on at least one surface of surface-treated copper foil originating from the untreated copper foil; (d) subjecting the surface profile of the surface-treated copper foil to filter processing, the filter processing including processing using an L filter with the cutoff value; and (e) calculating at least one of surface parameters defined by ISO25178 on the surface of the surface-treated copper foil based on the surface profile after the filter processing.

10 Claims, 11 Drawing Sheets

(56) References Cited

FOREIGN PATENT DOCUMENTS

| | | | |
|---|---|---|---|
| JP | 2020-50954 A | | 4/2020 |
| JP | 2020-128589 A | | 8/2020 |
| JP | 2020163829 A | * | 10/2020 |
| KR | 20210024179 A | * | 3/2021 |
| WO | WO 2008/041706 A1 | | 4/2008 |
| WO | WO 2017/006739 A1 | | 1/2017 |
| WO | WO 2018/198905 A1 | | 11/2018 |
| WO | WO2019082584 A1 | * | 10/2020 |
| WO | WO-2021157362 A1 | * | 8/2021 |
| WO | WO-2021157363 A1 | * | 8/2021 |
| WO | WO-2021193246 A1 | * | 9/2021 |

OTHER PUBLICATIONS

Markus Prieske, "Dry Metal Forming Open Access Journal", Jun. 12, 2020 (Year: 2020).*
ISR for PCT/JP2021/047646, dated Mar. 1, 2022 (w/ translation).
"Guidelines for high-speed transmission line test methods of the flexible printed wiring board, first edition", Japan Electronics Packaging and Circuits Association, Jun. 5, 2019 (w/ partial translation).
Decision to Grant for JP App. No. 2023-562765, dated Nov. 8, 2023 (w/ translation).

* cited by examiner

METHOD FOR MEASURING SURFACE PARAMETER OF COPPER FOIL, METHOD FOR SORTING COPPER FOIL, AND METHOD FOR PRODUCING SURFACE-TREATED COPPER FOIL

TECHNICAL FIELD

The present invention relates to a method for measuring a surface parameter of copper foil, a method for selecting copper foil, and a method for producing surface-treated copper foil.

BACKGROUND ART

Copper foil is widely used in a step for producing a printed-wiring board in a form of a copper-clad laminated sheet in which copper foil is adhered to an insulating resin substrate. In this regard, the copper foil and the insulating resin substrate desirably have strong adhesive force in order to prevent wiring from being peeled during production of a printed-wiring board. Therefore, in usual copper foil for producing a printed-wiring board, adhesiveness is increased by subjecting a surface to be adhered to copper foil to a surface treatment such as a roughening treatment, to form irregularities formed from fine copper particles, and causing the irregularities to dig into the inside of the insulating resin substrate through pressing to exert anchor effect.

As portable electronic devices and the like are made more functional in recent years, frequencies of signals become increasingly high so as to process a profusion of information at high speed, and printed-wiring boards suitable for high frequency application are desired. Transmission loss is desirably reduced for such printed-wiring boards for high frequencies in order to make it possible to transmit a high frequency signal without deteriorating quality. A printed-wiring board includes copper foil processed to have a wiring pattern and an insulating substrate, and main losses in transmission loss include conductor loss resulting from the copper foil and dielectric loss resulting from the insulating substrate.

As copper foil used for a printed-wiring board for high frequencies, Patent Literature 1 (JP2020-50954A) discloses finely roughened electrodeposited copper foil having a finely roughened surface that includes a plurality of peaks, a plurality of recessed grooves, and a plurality of fine crystal clusters, and indicates that according to the copper foil, loss during signal transportation can be effectively suppressed, for example. Patent Literature 1 also indicates that the Rlr value of the copper foil is measured under conditions of $\lambda s=2.5$ μm and $\lambda c=0.003$ mm using a laser microscope.

High frequency characteristics (frequency dependency of transmittance loss) of a printed-wiring board is known to correlate with surface roughness of copper foil, and the lower the roughness of copper foil used, the better the high frequency characteristics, in general. As a method for measuring surface roughness of copper foil, Non-Patent Literature 1 (guidelines for high-speed transmission line test methods of the flexible printed wiring board, first edition) discloses a method for testing, in a three-dimensional manner, a surface profile of copper foil for a high-frequency transmission line, for example. Non-Patent Literature 1 indicates that, in this test method, an arithmetical mean height Sa is obtained by processing with a predetermined S filter (0.5 μm or 0.8 μm) and an L filter (25 μm, 50 μm, or 80 μm) using a measurement device (confocal microscope) in accordance with ISO25178.

CITATION LIST

Patent Literature

Patent Literature 1: JP2020-50954A
Patent Literature 2: JPH9-241882A
Patent Literature 3: WO2008/041706A1

Non-Patent Literature

Non-Patent Literature 1: Guidelines for high-speed transmission line test methods of the flexible printed wiring board, first edition, Japan Electronics Packaging and Circuits Association, issued on Jun. 5, 2019

SUMMARY OF INVENTION

However, surface parameters calculated by a conventional method for measuring surface roughness of copper foil have not always had sufficient correlation with high frequency characteristics.

The present inventors have now found that setting a cutoff value for an L filter on the basis of a surface profile of untreated copper foil, and subsequently processing a surface profile of surface-treated copper foil originating from the untreated copper foil with an L filter with the preliminarily set cutoff value to calculate a surface parameter defined in ISO25178, provides the surface parameter exhibiting high correlation with high frequency characteristics.

Accordingly, an object of the present invention is to provide a method for measuring a surface parameter of copper foil exhibiting high correlation with high frequency characteristics.

According to an aspect of the present invention, there is provided a method for measuring a surface parameter of copper foil, comprising the steps of:
 (a) acquiring a surface profile on at least one surface of an untreated copper foil;
 (b) setting a cutoff value for an L filter based on the surface profile;
 (c) acquiring a surface profile on at least one surface of a surface-treated copper foil originating from the untreated copper foil;
 (d) subjecting the surface profile of the surface-treated copper foil to filter processing, the filter processing including processing using an L filter with the cutoff value; and
 (e) calculating at least one of surface parameters defined by ISO25178 on the surface of the surface-treated copper foil based on the surface profile after the filter processing.

According to another aspect of the present invention, there is provided a method for selecting copper foil, comprising the steps of:
 measuring a surface parameter of copper foil using the above method, wherein the surface parameter is at least one selected from the group consisting of an arithmetical mean height Sa, a root mean square height Sq, a maximum height Sz, a developed interfacial area ratio Sdr, a core material volume Vmc, and a core height Sk defined by ISO25178; and
 selecting, as a copper foil suitable for a printed-wiring board for high frequency application, a copper foil having a surface in which the Sa is 1.2 μm or less, the Sq is 2.5 µm or less, the Sz is 14 µm or less, the Sdr is 60% or less, the Vmc is 1.5 µm³ or less, and/or the Sk is 4 µm or less.

According to another aspect of the present invention, there is provided a method for producing surface-treated copper foil, comprising the steps of:

providing an untreated copper foil;

subjecting, to a surface treatment, at least one surface of the untreated copper foil to produce a surface-treated copper foil;

measuring a surface parameter of the surface-treated copper foil using the above method; and submitting the surface-treated copper foil for shipping or recognizing the surface-treated copper foil as one to be shipped only when the surface parameter satisfies a predetermined condition, wherein at least one surface of the untreated copper foil is subjected to acquisition of the surface profile in the step (a), and the surface subjected to the surface treatment of the surface-treated copper foil is subjected to acquisition of the surface profile in the step (c).

According to another aspect of the present invention, there is provided a method for producing a printed-wiring board for high frequency application, comprising the step of:

producing a printed-wiring board for high frequency application using a copper foil obtained by the above method.

DESCRIPTION OF EMBODIMENTS

Definition

Definitions of terms and parameters used to specify the present invention are shown below.

An "arithmetical mean height Sa" or "Sa" herein is a parameter defined in ISO25178 and representing an average of absolute values of the difference in height at each point to the mean of a surface. That is, the Sa corresponds to a parameter obtained by expanding the arithmetical mean height Ra of a contour curve to a surface.

A "root mean square height Sq" or "Sq" herein is a parameter defined in ISO25178 and corresponding to a standard deviation of distances from the mean of a surface and corresponds to a standard deviation of heights.

A "maximum height Sz" or "Sz" herein represents a distance from the highest point to the lowest point of a surface defined in ISO25178.

A "developed interfacial area ratio Sdr" or "Sdr" herein is a parameter defined in ISO25178 and representing how much a developed area (surface area) of a defined region increases from the area of the defined region. Here, the developed interfacial area ratio Sdr herein is represented as an increase (%) in the surface area. The smaller this value is, the closer the surface shape is to flat, and the Sdr of a completely flat surface becomes 0%. On the other hand, the larger this value is, the more irregularities the surface shape has. For example, when the Sdr of a surface is 40%, the surface area of this surface increases by 40% from a completely flat surface.

Figure 1:
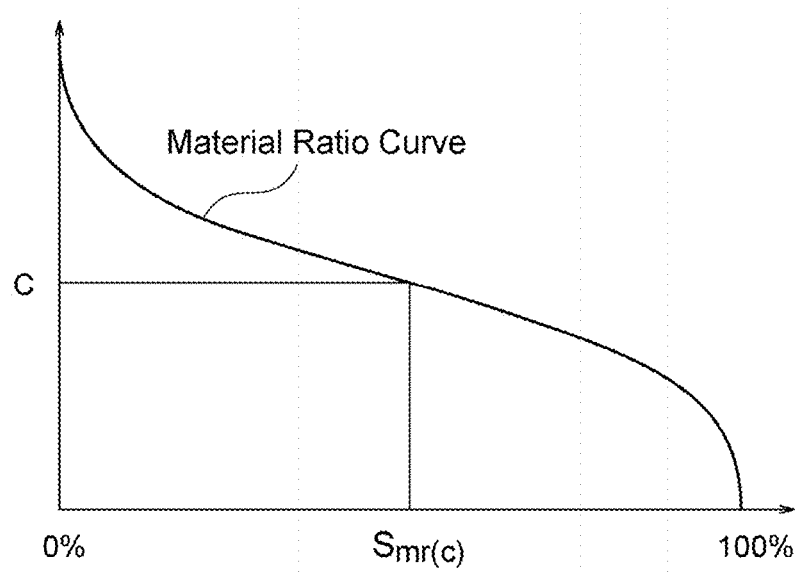
FIG. 1 is a diagram explaining a material ratio curve and an areal material ratio determined in accordance with ISO25178.
Figure 2:
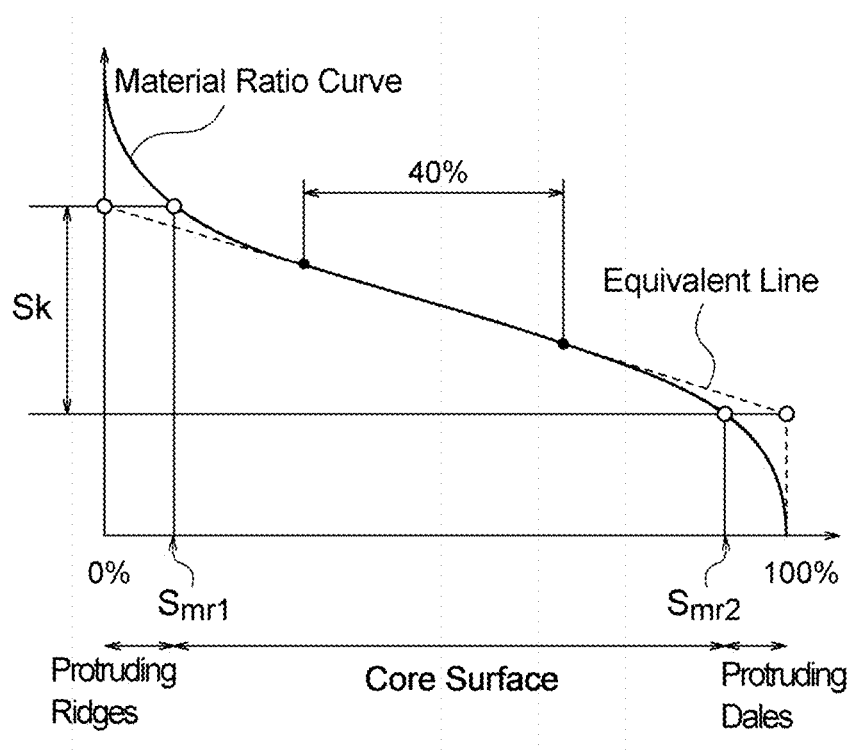
FIG. 2 is a diagram explaining an areal material ratio Smr1 segmenting protruding ridges and a core surface, an areal material ratio Smr2 segmenting protruding dales and the core surface, and a core height Sk of the core surface determined in accordance with ISO25178.

An "areal material ratio curve" (hereinafter, simply referred to as the "material ratio curve") herein is a curve defined in ISO25178 and representing a height at which the areal material ratio becomes 100% from 0%. The areal material ratio is a parameter representing an area of a region above a certain height c, as shown in FIG. 1. The areal material ratio at the height c corresponds to the Smr (c) in FIG. 1. As shown in FIG. 2, when a secant line of the material ratio curve extending from the areal material ratio of 0% along the material ratio curve with the difference in the areal material ratio of 40% is shifted from the areal material ratio of 0%, the position at which the secant line has the smallest gradient is referred to as a center portion of the material ratio curve. A straight line on which the sum of squares of deviations in the vertical axis direction becomes the smallest with respect to this center portion is referred to as an equivalent line. A portion included in the range of height in which the areal material ratio is 0% to 100% on the equivalent line is referred to as a core surface. The portion higher than the core surface is referred to as protruding ridges, and the portion lower than the core surface is referred to as protruding dales.

A "core height Sk" or "Sk" herein is a value defined in ISO25178 and obtained by subtracting a minimum height from a maximum height of the core surface, and is a parameter calculated from the difference in height between the areal material ratio of 0% and the areal material ratio of 100% on the equivalent line, as shown in FIG. 2.

Figure 3:
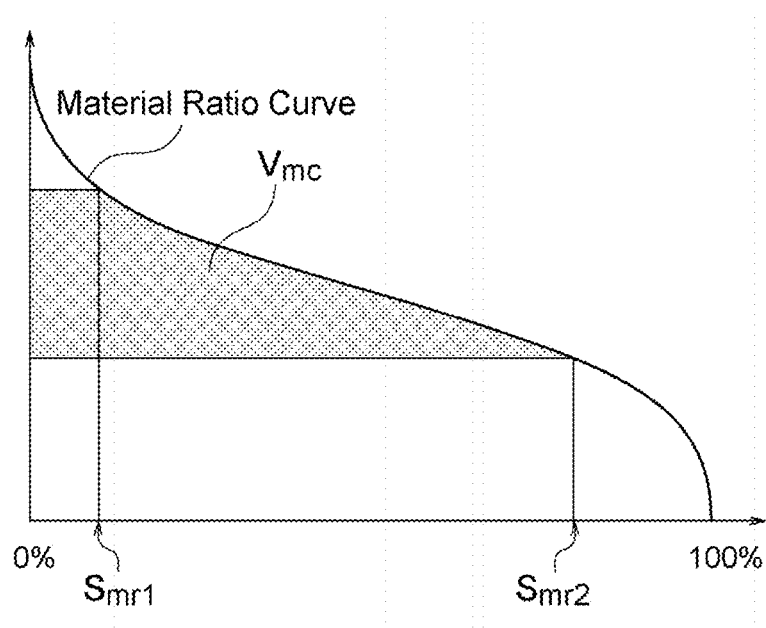
FIG. 3 is a diagram explaining a core material volume Vmc of the core surface determined in accordance with ISO25178.

A "core material volume Vmc" or "Vmc" herein is a parameter measured in accordance with ISO25178 and representing the volume of the core surface, as shown in FIG. 3. The Vmc herein is calculated with an areal material ratio Smr1 segmenting the core surface and the protruding ridges set to 10%, and an areal material ratio Smr2 segmenting the core surface and the protruding dales set to 80%.

Figure 4:
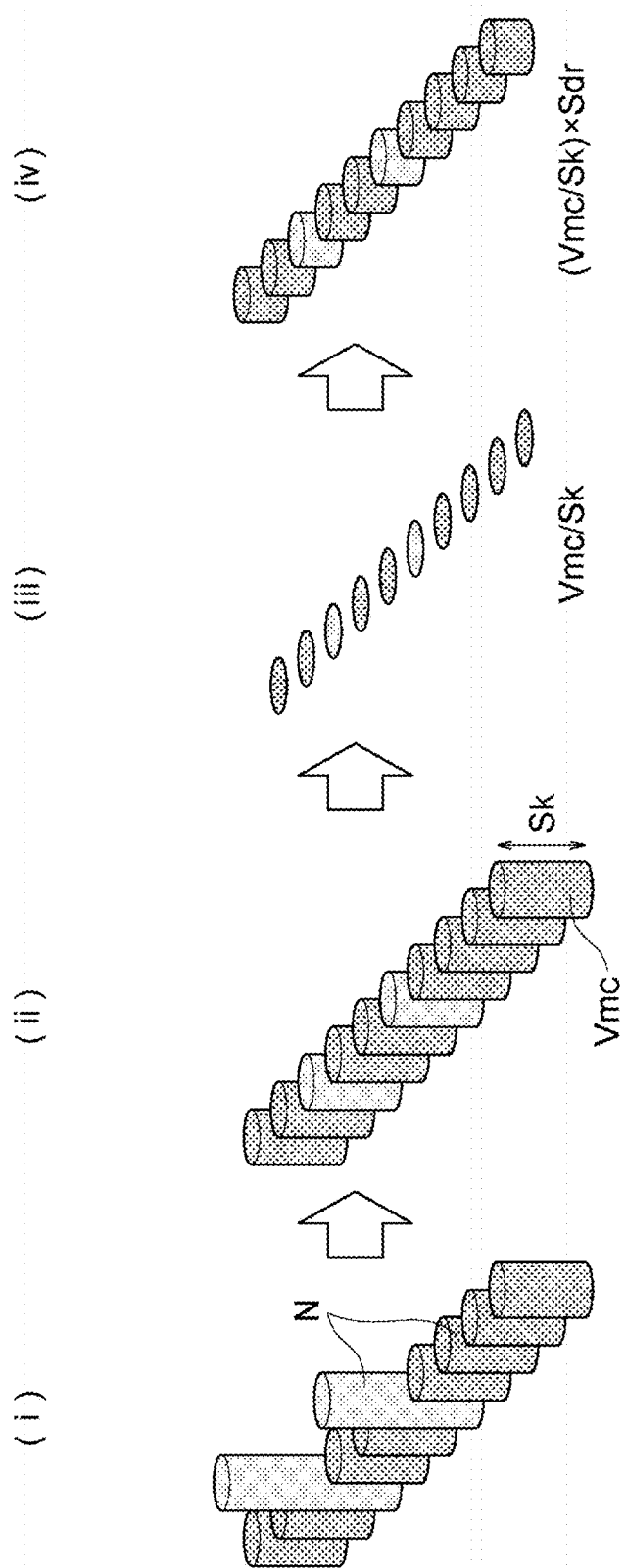
FIG. 4 is a schematic diagram of a copper foil surface having a plurality of nodules, the diagram explaining an α value.

An "α value" herein means a parameter obtained by dividing the core material volume Vmc by the core height Sk to obtain a quotient and multiplying the quotient by the developed interfacial area ratio Sdr, that is, obtained by the formula (Vmc/Sk)×Sdr. FIG. 4 illustrates a schematic diagram of a copper foil surface for explaining the α value. In the copper foil surface having a plurality of nodules N as shown in (i) of FIG. 4, the Vmc corresponds to the volume of the core surface in which protrusions are removed from the nodules N, and the Sk corresponds to the height of the core surface (see (ii) of FIG. 4). Accordingly, the value Vmc/Sk obtained by dividing the Vmc by the Sk corresponds to the area of the core surface (see (iii) of FIG. 4), and the α value obtained by multiplying the quotient of Vmc/Sk by the Sdr is considered to be a parameter reflecting the Sdr of the core surface (see (iv) of FIG. 4).

"Untreated copper foil" herein refers to copper foil in a state of not being subjected to a surface treatment such as a roughening treatment or a rust proofing treatment. The copper foil herein may be copper foil (so-called carrier-attached copper foil) including a support layer, a release layer, and a superthin copper layer.

"Surface-treated copper foil originating from untreated copper foil" herein refers to copper foil obtained by subjecting untreated copper foil to a surface treatment such as a roughening treatment or a rust proofing treatment.

An "electrode surface" of electrodeposited copper foil herein refers to a surface having been in contact with a cathode during production.

A "deposition surface" of electrodeposited copper foil herein refers to a surface on which electrodeposited copper is deposited during production, that is, a surface not in contact with a cathode.

An "L filter" herein is a filter for removing a long wavelength component and is also referred to as "λc" in measurement (line roughness measurement) in a contour curve method. That is, the L filter is a filter for removing a large-scale wavelength component such as waviness of copper foil.

An "S filter" herein is a filter for removing a short wavelength component and is also referred to as "λs" in measurement (line roughness measurement) in a contour curve method. That is, the S filter is a filter for removing a small-scale wavelength component such as a roughening treatment of copper foil.

Method for Measuring Surface Parameter of Copper Foil

The method of the present invention is a method for measuring a surface parameter of copper foil. This method includes the steps of (1) acquisition of a surface profile of untreated copper foil, (2) setting of a cutoff value for an L filter, (3) acquisition of a surface profile of surface-treated copper foil, (4) filter processing of the surface profile of the surface-treated copper foil, and (5) calculation of a surface parameter of the surface-treated copper foil.

Hereinafter, each of steps (1) to (5) will be described with reference to drawings.

(1) Acquisition of Surface Profile of Untreated Copper Foil

Figure 5:
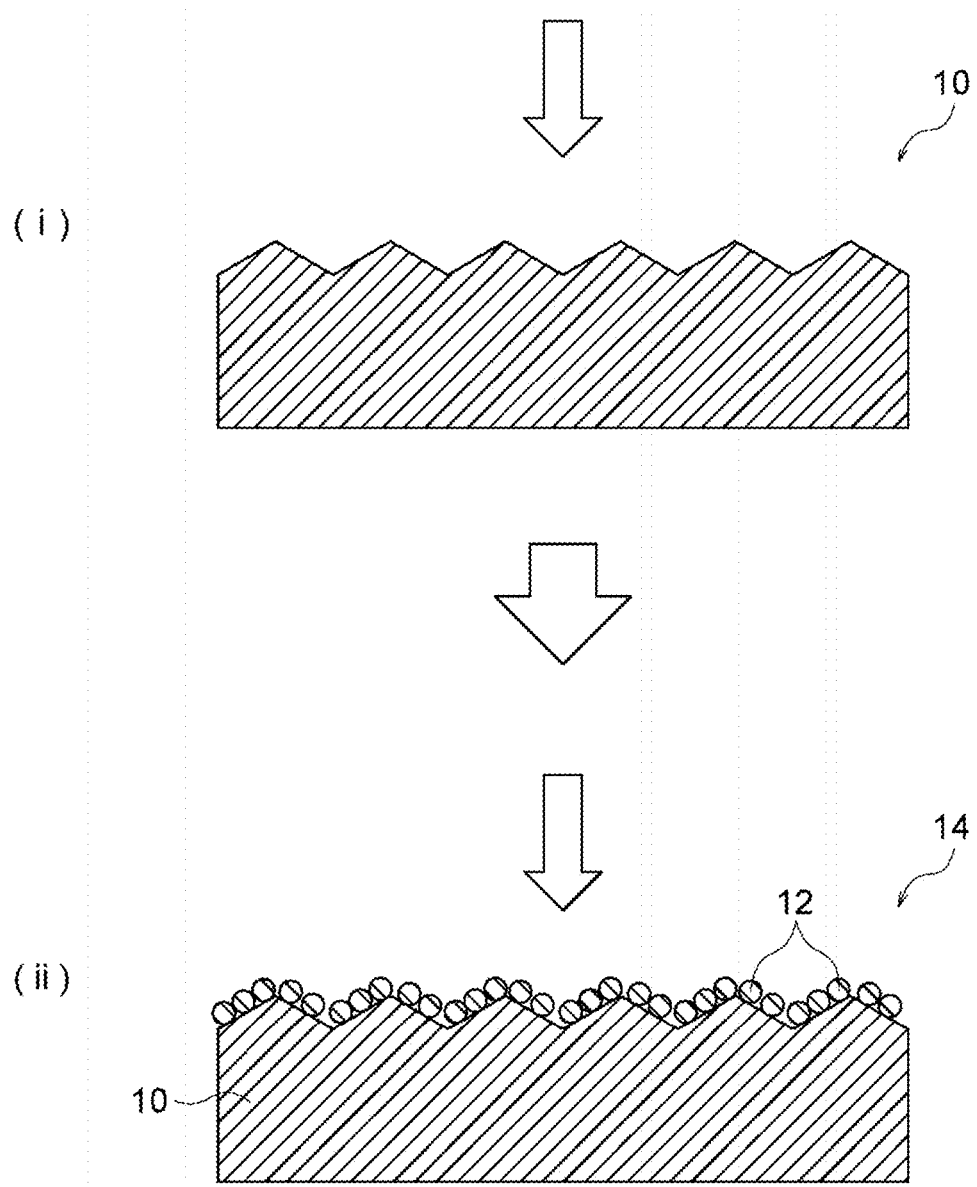
FIG. 5 is a step flowchart for explaining a method for measuring a surface parameter of copper foil according to the present invention.

FIG. 5 illustrates an example of the method for measuring a surface parameter of copper foil according to the present invention. As illustrated in (i) of FIG. 5, a surface profile of at least one surface of untreated copper foil 10 is acquired. The surface profile may be acquired with respect to one surface of the untreated copper foil 10, or the surface profile may be acquired with respect to both surfaces of the untreated copper foil 10.

The surface profile of the untreated copper foil 10 can be preferably acquired by measuring a surface of the untreated copper foil 10 using a non-contact type surface roughness measurement instrument, for example, a commercially available laser microscope. When measurement is carried out by a laser microscope, the measurement area is preferably 90 μm$^2$ or more and 103,000 μm$^2$ or less, more preferably 1,000 μm$^2$ or more and 26,000 μm$^2$ or less, and still more preferably 1,000 μm$^2$ or more and 17,000 μm$^2$ or less. In addition, the measurement magnification of the laser microscope is preferably 50 times or more and 500 times or less and more preferably 100 times or more and 400 times or less.

The untreated copper foil 10 may be produced according to a known method and known conditions or may be a commercially available product. In addition, the untreated copper foil 10 may be any of electrodeposited copper foil and rolled copper foil and is preferably electrodeposited copper foil. When the untreated copper foil 10 is electrodeposited copper foil, although the surface profile may be acquired with respect to any of an electrode surface and a deposition surface of the electrodeposited copper foil, the surface profile of a surface to be treated is preferably acquired.

(2) Setting of Cutoff Value for L Filter

A cutoff value for the L filter is set on the basis of the acquired surface profile of the untreated copper foil 10. A surface parameter exhibiting high correlation with high frequency characteristics can be calculated in a step described later by doing so.

As described above, in usual copper foil for producing a printed-wiring board, adhesiveness with an insulating resin substrate is improved by subjecting a bonding surface of the copper foil to a surface treatment such as a roughening treatment. In this regard, in a conventional measurement method, surface profile measurement or the like has been carried out for copper foil (surface-treated copper foil) after a surface treatment in order to evaluate performance of a copper foil product. However, it could not be said that surface parameters calculated by this method always have sufficient correlation with high frequency characteristics.

While the cause thereof is not entirely sure, it is considered to be as follows. That is, irregularities on a treated surface of surface-treated copper foil include a roughness component associated with nodules (roughening particles and the like) and a waviness component associated with waviness of copper foil. In this regard, transmission loss in a printed-wiring board is increased by the skin effect of copper foil which is prominently exhibited as the frequency becomes higher, but the waviness component hardly affects transmission loss, and the roughness component mainly affects transmission loss. Therefore, it is considered that if the waviness component can be selectively eliminated by subjecting surface profiles of the surface-treated copper foil to filter processing, a surface parameter originating from the roughness component having high correlation with high frequency characteristics can be calculated. However, as illustrated in (ii) of FIG. 5, nodules 12 (for example, roughening particles) or the like are formed through a surface treatment on waviness of the untreated copper foil 10 to provide the surface-treated copper foil 14. Therefore, when filter conditions are determined on the basis of the surface profile of the surface-treated copper foil, it is difficult to determine conditions for selectively eliminating the waviness component because of influence from the roughness component (roughness component and the like caused by the nodules 12 or the like) resulting from the surface treatment. Accordingly, it cannot be said that surface parameters of surface-treated copper foil calculated by a conventional method always have sufficient correlation with high frequency characteristics.

On the other hand, in the method of the present invention, the surface profile of the untreated copper foil before surface treatment is measured prior to measurement of the surface profile of surface-treated copper foil, and the cutoff value for the L filter is set. Consequently, a condition for the L filter capable of selectively eliminating the waviness component can be set without being affected by the roughness component resulting from a surface treatment. Accordingly, a surface parameter of the surface-treated copper foil having high correlation with high frequency characteristics can be calculated by adopting this condition for the L filter as a condition for filter processing of the surface-treated copper foil.

According to a preferable aspect of the present invention, the cutoff value for the L filter is set so as to satisfy the following items: (i) Sa1, which is the Sa after processing with the L filter, is 0.5 µm or less; and (ii) the percent change of Sdr before and after processing with the L filter represented by the formula (|Sdr0−Sdr1|/Sdr0)×100 (in the formula, Sdr0 is the Sdr before processing with the L filter, and Sdr1 is the Sdr after processing with the L filter) is 80% or less. The cutoff value for the L filter is more preferably set such that Sa1 is 0.3 µm or less and the percent change of Sdr is 70% or less, is still more preferably set such that Sa1 is 0.001 µm or more and 0.3 µm or less and the percent change of Sdr is 0.1% or more and 60% or less, and is especially preferably set such that Sa1 is 0.005 µm or more and 0.2 µm or less and the percent change of Sdr is 1% or more and 40% or less. That is, Sa1 is preferably 0.5 µm or less, more preferably 0.3 µm or less, still more preferably 0.001 µm or more and 0.3 µm or less, and especially preferably 0.005 µm or more and 0.2 µm or less. When Sa1 falls within the above ranges, the waviness component hardly affecting high frequency characteristics can be more effectively eliminated. In addition, the percent change of Sdr is preferably 80% or less, more preferably 70% or less, still more preferably 0.1% or more and 60% or less, and especially preferably 1% or more and 40% or less. When the percent change of Sdr falls within the above ranges, the roughness component (nodule component) largely affecting high frequency characteristics can be left more reliably. That is, when processing with the L filter with a cutoff value for eliminating the roughness component is carried out, the percent change of Sdr increases. Therefore, elimination of the roughness component which is required for evaluation of high frequency characteristics can be effectively suppressed by controlling the percent change of Sdr to fall within the above ranges. Accordingly, a surface parameter of the surface-treated copper foil having higher correlation with high frequency characteristics can be calculated in a step described later by setting the cutoff value for the L filter so as to satisfy the above conditions.

According to another preferable aspect of the present invention, the cutoff value for the L filter is set so as to satisfy the following items: (i) Sa1, which is the Sa after processing with the L filter, is 0.5 µm or less; and (ii') the percent change of α value before and after processing with the L filter represented by the formula (|α0−α1|/α0)×100 (in the formula, α0 is the α value before processing with the L filter, and α1 is the α value after processing with the L filter) is 80% or less. The cutoff value for the L filter is more preferably set such that Sa1 is 0.3 µm or less and the percent change of α value is 70% or less, is still more preferably set such that Sa1 is 0.001 µm or more and 0.3 µm or less and the percent change of α value is 0.1% or more and 60% or less, and is especially preferably set such that Sa1 is 0.005 µm or more and 0.2 µm or less and the percent change of a value is 1% or more and 40% or less. That is, Sa1 is preferably 0.5 µm or less, more preferably 0.3 µm or less, still more preferably 0.001 µm or more and 0.3 µm or less, and especially preferably 0.005 µm or more and 0.2 µm or less. When Sa1 falls within the above ranges, the waviness component hardly affecting high frequency characteristics can be more effectively eliminated. In addition, the percent change of α value is preferably 80% or less, more preferably 70% or less, still more preferably 0.1% or more and 60% or less, and especially preferably 1% or more and 40% or less. When the percent change of α value falls within the above ranges, the roughness component (nodule component) largely affecting high frequency characteristics can be left more reliably. That is, when filter processing is carried out at a cutoff value for eliminating the roughness component, the percent change of α value increases. Therefore, elimination of the roughness component which is required for evaluation of high frequency characteristics can be effectively suppressed by controlling the percent change of α value to fall within the above ranges. Accordingly, a surface parameter of the surface-treated copper foil having higher correlation with high frequency characteristics can be calculated in a step described later by setting the cutoff value for the L filter so as to satisfy the above conditions.

The cutoff value for the L filter may be set as follows. Firstly, the surface profile of the untreated copper foil 10 is analyzed provisionally using multiple cutoff values for the L filter, and a surface parameter with each cutoff value is calculated. Then, a preferable cutoff value is determined among the multiple cutoff value on the basis of the calculated surface parameters. The cutoff value can be successfully determined in such a manner by obtaining a changing point according to the conditions described in the examples of the present specification, for example.

(3) Acquisition of Surface Profile of Surface-Treated Copper Foil

As illustrate in (ii) of FIG. 5, a surface profile on at least one surface of the surface-treated copper foil 14 originating from the untreated copper foil 10 is acquired. The surface-treated copper foil 14 may be copper foil obtained by subjecting the untreated copper foil 10 to any surface treatment. Examples of such a surface treatment include a roughening treatment, a rust proofing treatment, a coupling agent treatment, and any combination thereof. For example, the surface-treated copper foil 14 preferably includes roughening particles (nodules) by subjecting the untreated copper foil 10 to at least a roughening treatment, but may be copper foil obtained by subjecting the untreated copper foil 10 only to a rust proofing treatment without a roughening treatment.

The surface of the surface-treated copper foil 14 the surface profile of which is to be acquired is preferably a surface obtained by subjecting the untreated copper foil 10 to a surface treatment. In addition, the surface of the surface-treated copper foil 14 the surface profile of which is to be acquired is typically a surface on the same side as the surface of the untreated copper foil 10 the surface profile of which has been acquired. When both surfaces of the untreated copper foil 10 have similar surface profiles (for example, in the case of rolled copper foil), the surface of the untreated copper foil 10 the surface profile of which has been acquired may be the opposite side of the surface of the surface-treated copper foil 14 the surface profile of which is to be acquired.

The surface profile of the surface-treated copper foil 14 can be acquired using various known devices such as an atomic force microscope (AFM), a contact-type surface roughness measuring device, and a non-contact-type surface roughness measuring device. For example, the surface profile is preferably acquired by measuring a surface of the surface-treated copper foil 14 using a commercially available laser microscope, which is a non-contact-type surface roughness measuring device. The conditions described above for acquisition of the surface profile of the untreated copper foil 10 can be directly adopted as measurement conditions for the laser microscope.

averaged (removed). Accordingly, small nodules (roughening particles and the like) present on the surface-treated copper foil 14 can be more reliably detected by carrying out filter processing without using an S filter, and a surface parameter having higher correlation with high frequency characteristics can be calculated as a result.

(5) Calculation of Surface Parameter of Surface-Treated Copper Foil

At least one of the surface parameters defined in ISO25178 on the surface of the surface-treated copper foil 14 on the basis of the surface profile after filter processing. The surface parameter calculated through the above described steps is a parameter from which effect of the waviness component is eliminated enough and which accurately reflects the roughness component of the surface-treated copper foil 14, and thus has high correlation with high frequency characteristics.

Preferable examples of the surface parameter to be calculated include an Sa, a Sq, a Sz, a Sdr, a Vmc, a Sk, and a combination thereof (for example an α value), are more preferably an Sa, a Sq, a Sdr, a Vmc, a Sk, and a combination thereof, still more preferably an Sa, a Sdr, a Vmc, a Sk, and a combination thereof, and especially preferably an Sa, a Sdr, and the combination thereof. When the surface parameter is any of these surface parameters, higher correlation with high frequency characteristics is provided.

Method for Selecting Copper Foil

According to a preferable aspect of the present invention, a method for selecting copper foil is provided. This method for selecting copper foil involves a step of measuring a surface parameter of copper foil according to the above-described method, and a step of selecting copper foil having a predetermined surface parameter as copper foil suitable for a printed-wiring board for high frequency application.

The surface parameter of the copper foil measured in the present aspect is at least one selected from the group consisting of an Sa, a Sq, a Sz, a Sdr, a Vmc, and a Sk. Then, copper foil having a surface having an Sa, a Sdr, a Vmc, and/or a Sk satisfying the ranges shown in Table 1 is selected as copper foil suitable for a printed-wiring board for high frequency application.

TABLE 1

|  | Sa | Sq | Sz | Sdr | Vmc | Sk |
| --- | --- | --- | --- | --- | --- | --- |
| Suitable range | 1.2 μm or less | 2.5 μm or less | 14 μm or less | 60% or less | 1.5 μm$^3$ or less | 4 μm or less |
| Preferable range | 0.05 μm or more 1.0 μm or less | 0.05 μm or more 2.0 μm or less | 0.5 μm or more 5.0 μm or less | 0.5% or more 60% or less | 0.05 μm$^3$ or more 1.4 μm$^3$ or less | 0.15 μm or more 3.0 μm or less |
| More preferable range | 0.05 μm or more 0.5 μm or less | 0.05 μm or more 1.0 μm or less | 0.5 μm or more 3.0 μm or less | 0.5% or more 60% or less | 0.05 μm$^3$ or more 0.7 μm$^3$ or less | 0.15 μm or more 1.6 μm or less |
| Still more preferable range | 0.05 μm or more 0.15 μm or less | 0.05 μm or more 0.5 μm or less | 0.5 μm or more 2.0 μm or less | 0.5% or more 20% or less | 0.05 μm$^3$ or more 0.2 μm$^3$ or less | 0.15 μm or more 0.5 μm or less |

(4) Filter Processing of Surface Profile of Surface-Treated Copper Foil

The acquired surface profile of the surface-treated copper foil 14 is subjected to filter processing. This filter processing involves processing using the L filter with the cutoff value set on the basis of the surface profile of the untreated copper foil 10. The waviness component of copper foil hardly affecting high frequency characteristics as described above can be selectively eliminated by doing so, making it possible to calculate a surface parameter reflecting the roughness component largely affecting high frequency characteristics.

The filter processing is preferably conducted without using an S filter. If processing with an S filter is conduced, irregularities smaller than a cutoff value for the S filter are As described above, the surface parameter of copper foil measured by the method of the present invention has high correlation with high frequency characteristics and thus can be used as an alternative index for high frequency characteristics. In this regard, copper foil having a surface with a surface parameter satisfying the above ranges can be determined as copper foil especially excellent in high frequency characteristics and thus can be considered as copper foil suitable for a printed-wiring board for high frequency application.

Method for Producing Surface-Treated Copper Foil

The method for measuring a surface parameter of copper foil according to the present invention can be preferably used for product control, quality assurance, and the like.

According to a preferable aspect of the present invention, a method for producing surface-treated copper foil is provided. This method for producing surface-treated copper foil includes the steps of: providing untreated copper foil; subjecting, to a surface treatment, at least one surface of the untreated copper foil to produce surface-treated copper foil; measuring a surface parameter of the surface-treated copper foil using the above-described method; and submitting the surface-treated copper foil for shipping or recognizing the surface-treated copper foil as one to be shipped only when the surface parameter satisfies a predetermined condition.

That is, in this method for producing surface-treated copper foil, for at least one surface of provided untreated copper foil, (1) a surface profile is acquired, and (2) after setting a cutoff value for an L filter, untreated copper foil is subjected to a surface treatment to produce surface-treated copper foil. Thereafter, for the surface of the surface-treated copper foil subjected to a surface treatment, (3) a surface profile is acquired, (4) the surface profile of the surface-treated copper foil is subjected to filter processing, and (5) a surface parameter is calculated. Products with good quality can be easily and reliably selected and shipped by using the surface parameter calculated through these steps. Measurement of the surface profile of the surface-treated copper foil and calculation of the surface parameter may be carried out immediately after production of the surface-treated copper foil or may be carried out at the time of pre-shipment inspection.

The conditions described above for the method for selecting copper foil can be directly adopted as conditions that the surface parameter of the surface-treated copper foil should satisfy. In addition, preferable aspects of the untreated copper surface and the surface-treated copper foil are the same as those described above. The thickness (referring to the thickness of a superthin copper layer in the case of carrier-attached copper foil) of the surface-treated copper foil is preferably 0.5 µm or more and 210 µm or less and more preferably 0.5 µm or more and 70 µm or less.

The surface-treated copper foil is preferably used for a printed-wiring board for high frequency application of 1 GHz or more, more preferably 3 GHz or more, and still more preferably 20 GHz or more and 300 GHz or less.

Method for Producing Printed-Wiring Board

According to a preferable aspect of the present invention, a method for producing a printed-wiring board for high frequency application is provided. This method for producing a printed-wiring board includes a step of producing a printed-wiring board for high frequency application using copper foil obtained by the above described method. A known layer structure can be adopted for the printed-wiring board. That is, production of a printed-wiring board can employ a known method and known conditions and is not particularly limited except for using copper foil or surface-treated copper foil selected or produced by the methods of the present invention.

EXAMPLES

The present invention will be more specifically described with the following examples.

Examples A1 to A3

A cutoff value for an L filter was set on the basis of a surface profile of untreated copper foil according to the method of the present invention, and the correlation between the surface parameter of copper foil and high frequency characteristics was checked. Specifically, see the following.

Example A1

The correlation between a surface parameter of copper foil and high frequency characteristics was checked after setting a cutoff value for an L filter according to the method of the present invention.

(1) Provision of Untreated Copper Foil

Two kinds of copper foil (deposited foil) without change after electrodeposited foil production were provided, as untreated copper foil, as follows.

Untreated copper foil I: thickness of 18 µm or 35 µm, produced by the method disclosed in Patent Literature 2 (JPH9-241882A)

Untreated copper foil II: thickness of 18 µm, produced by the method disclosed in Patent Literature 3 (WO2008/041706A1)

(2) Acquisition of Surface Profile of Untreated Copper Foil

Surfaces of untreated copper foil I and untreated copper foil II were measured using a laser microscope (manufactured by Olympus Corporation, OLS-5000) under conditions of the measurement area of 4096 µm$^2$ and the magnification of 200 times to acquire surface profiles. This measurement was carried out on both of the electrode surface and the deposition surface for untreated copper foil I and was carried out only on the deposition surface for untreated copper foil II.

(3) Setting of Cutoff Value for L Filter

Figure 6A:
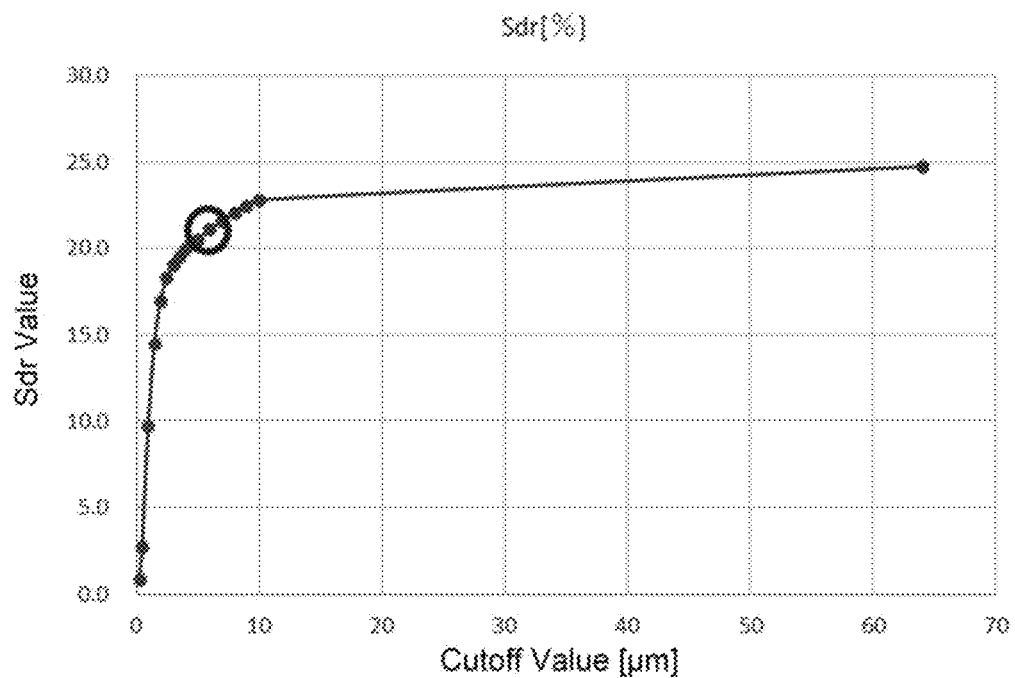
FIG. 6A is a graph showing the Sdr of a deposition surface of untreated copper foil I after processing with an L filter with each cutoff value in Example A1.
Figure 6B:
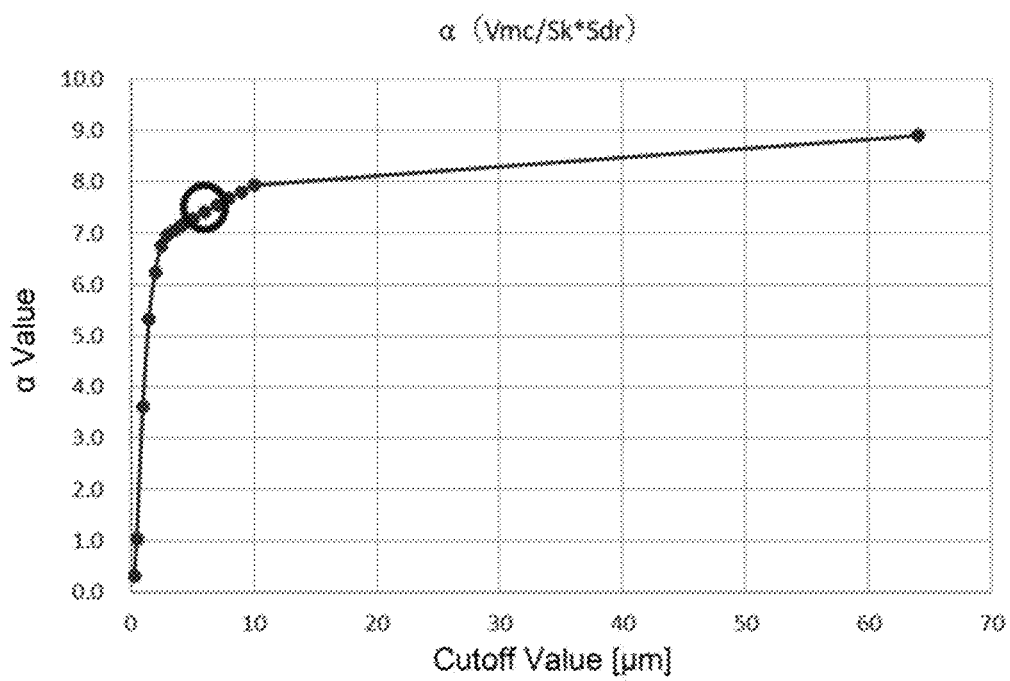
FIG. 6B is a graph showing the α value of a deposition surface of untreated copper foil I after processing with an L filter with each cutoff value in Example A1.
Figure 7:
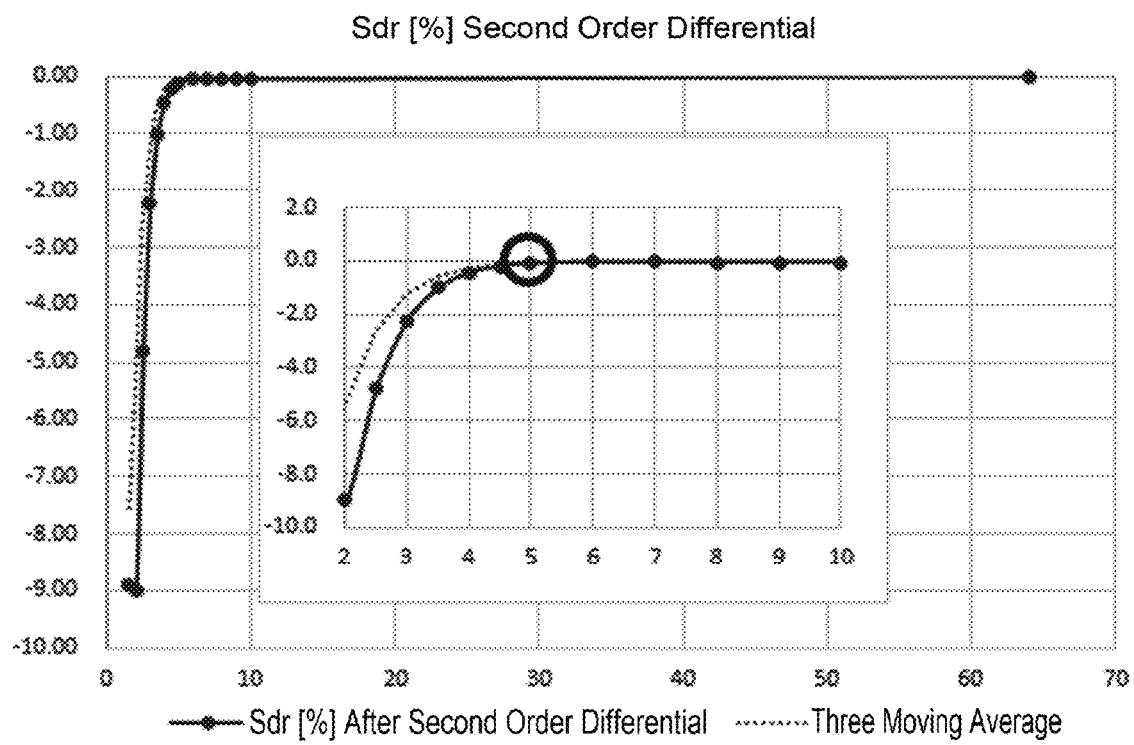
FIG. 7 is a graph showing second order differentials of the Sdr before and after processing with an L filter on a deposition surface of untreated copper foil I.
Figure 8A:
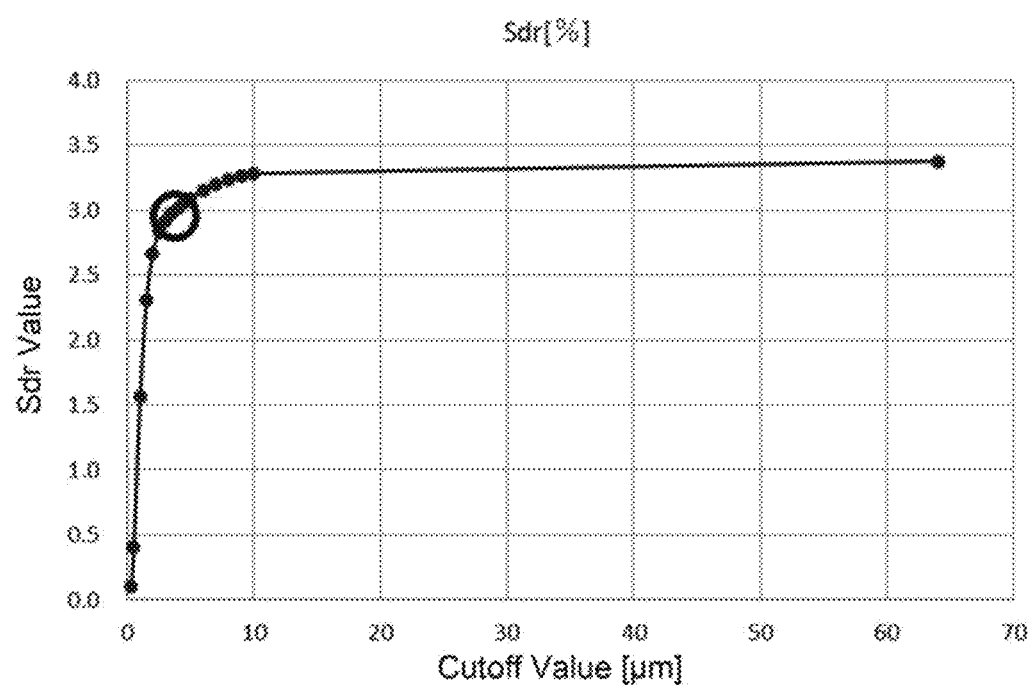
FIG. 8A is a graph showing the Sdr of an electrode surface of untreated copper foil I after processing with an L filter with each cutoff value in Example A1.
Figure 8B:
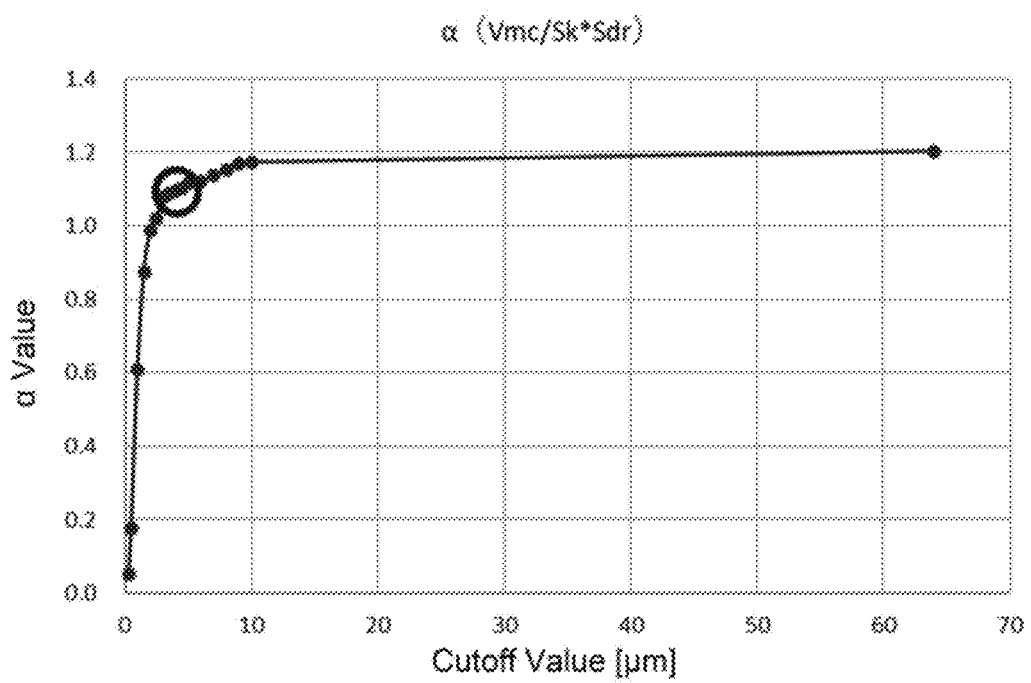
FIG. 8B is a graph showing the α value of an electrode surface of untreated copper foil I after processing with an L filter with each cutoff value in Example A1.
Figure 9:
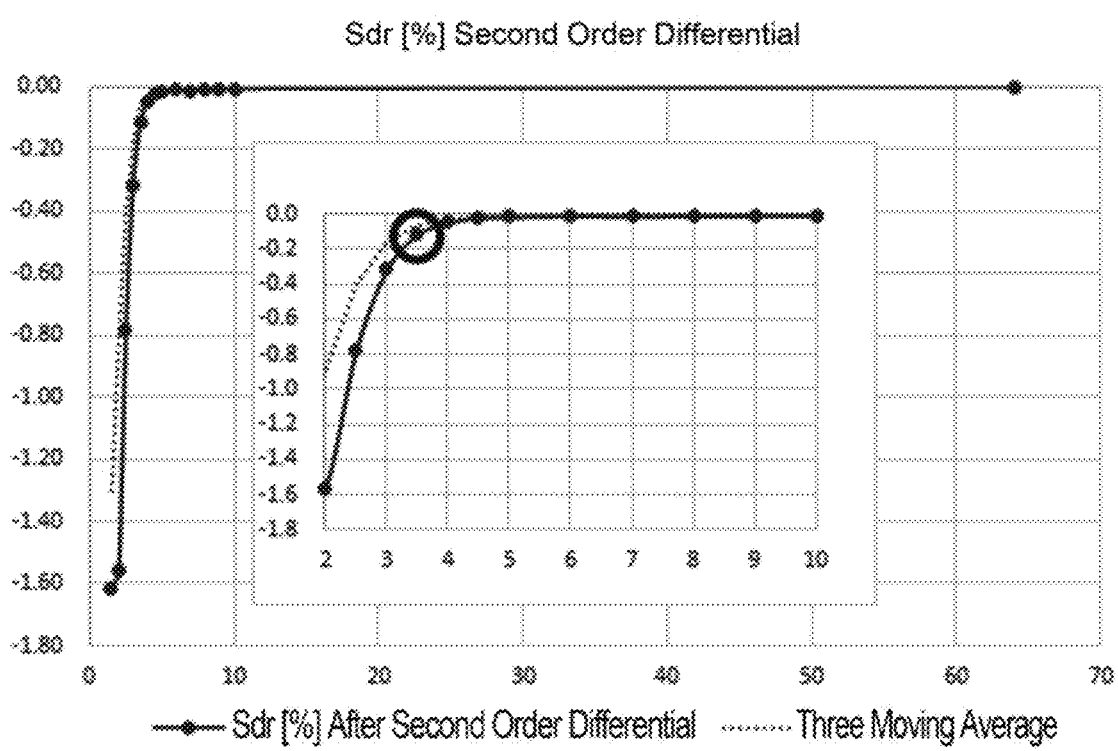
FIG. 9 is a graph showing second order differentials of the Sdr before and after processing with an L filter on an electrode surface of untreated copper foil I.
Figure 10A:
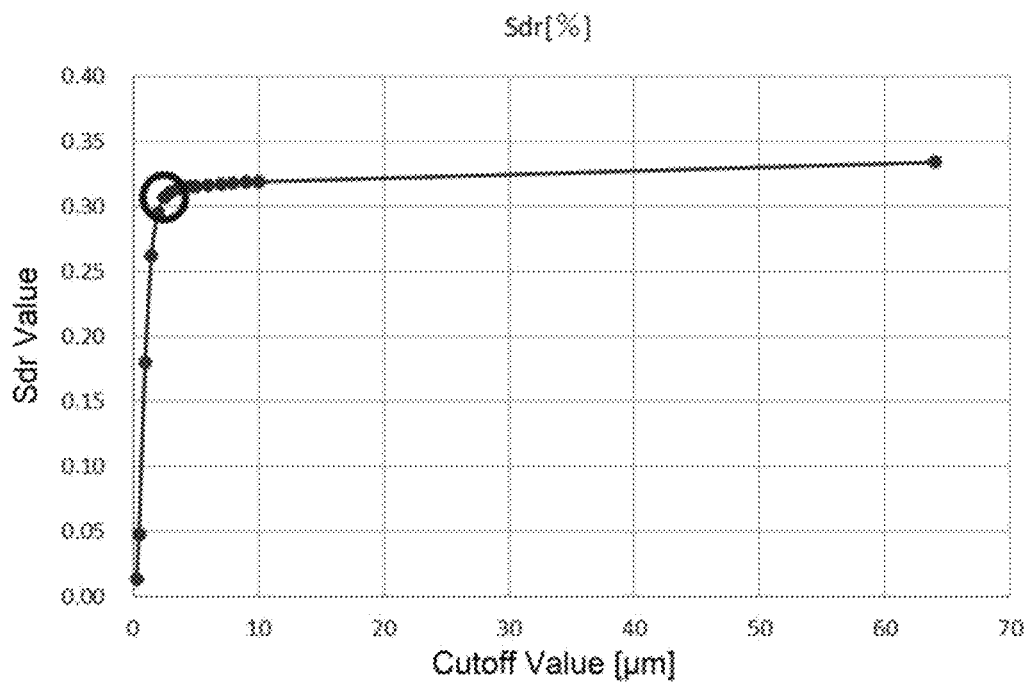
FIG. 10A is a graph showing the Sdr of a deposition surface of untreated copper foil II after processing with an L filter with each cutoff value in Example A1.
Figure 10B:
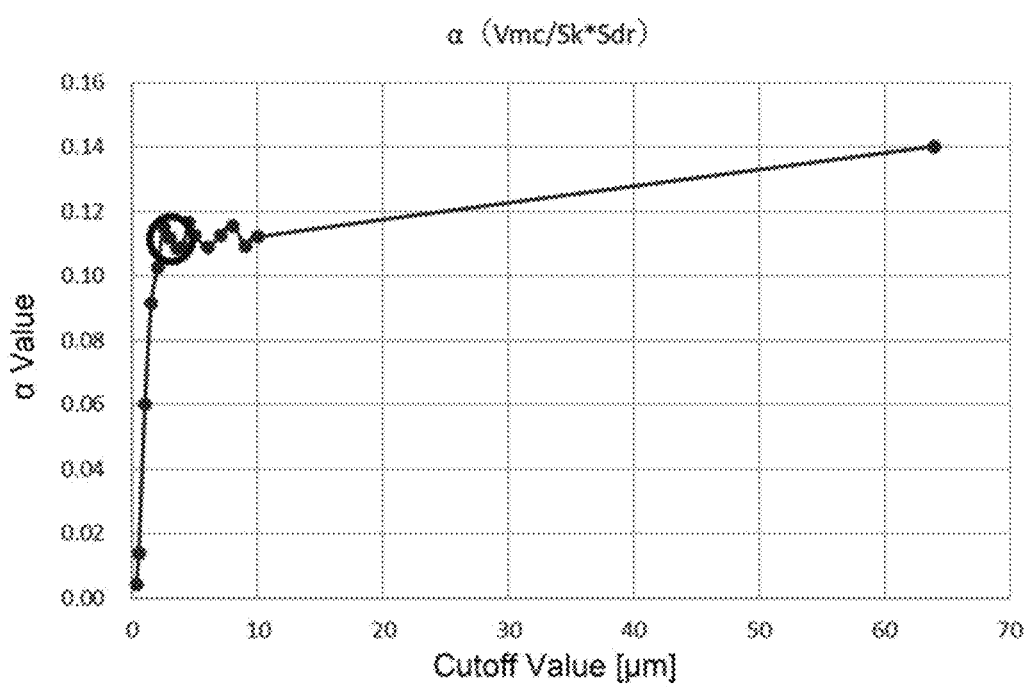
FIG. 10B is a graph showing the α value of a deposition surface of untreated copper foil II after processing with an L filter with each cutoff value in Example A1.
Figure 11:
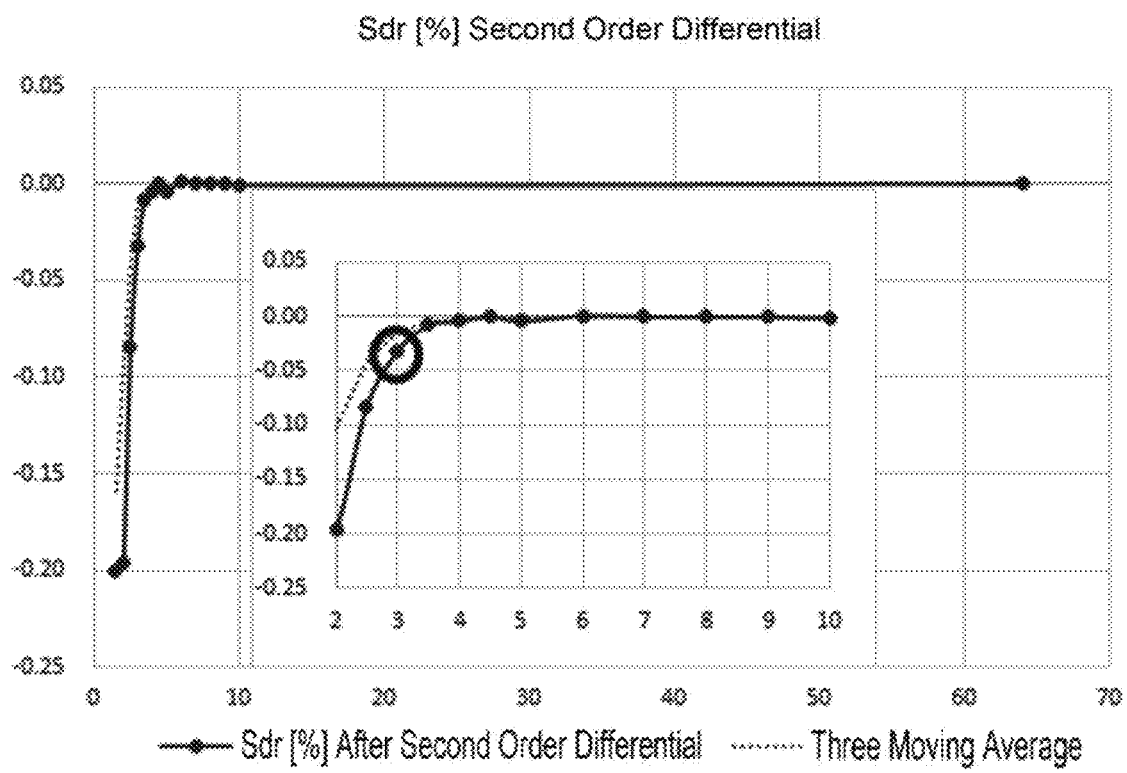
FIG. 11 is a graph showing second order differentials of the Sdr before and after processing with an L filter on a deposition surface of untreated copper foil II.

The Sdr, the Vmc, and the Sk were calculated by analyzing the obtained surface profiles of the untreated copper foil. Specifically, the Sdr, the Vmc, and the Sk after L filter processing with each cutoff value were calculated through analysis conducted with the cutoff value for the L filter changed to 0.3 µm, 0.5 µm, 1.0 µm, 1.5 µm, 2.0 µm, 2.5 µm, 3.0 µm, 3.5 µm, 4.0 µm, 4.5 µm, 5.0 µm, 6.0 µm, 7.0 µm, 8.0 µm, 9.0 µm, 10 µm, and 64 µm. In addition, the Sdr, the Vmc, and the Sk were also calculated in the same manner under conditions without cutoff with an L filter. The α value (=(Vmc/Sk)×Sdr) was calculated on the basis of the calculated Sdr, Vmc, and Sk, and the second order differential of the Sdr and the second order differential of the α value were calculated before and after L filter processing. FIGS. 6A and 6B show the Sdr and the α value after L filter processing with each cutoff value on the deposition surface of untreated copper foil I, respectively. FIG. 7 shows the second order differentials of the Sdr before and after L filter processing on the deposition surface of untreated copper foil I. In addition, FIGS. 8A and 8B show the Sdr and the α value after L filter processing with each cutoff value on the electrode surface of untreated copper foil I, respectively. FIG. 9 shows the second order differentials of the Sdr before and after L filter processing on the electrode surface of untreated copper foil I. Furthermore, FIGS. 10A and 10B show the Sdr and the α value after L filter processing with each cutoff value on the deposition surface of untreated copper foil II, respectively. FIG. 11 shows the second order differentials of the Sdr before and after L filter processing on the deposition surface of untreated copper foil II.

Each of the Sdr and the α value was confirmed to be the changing point at the L filter cutoff value of 5.0 µm on the deposition surface of untreated copper foil I (see FIGS. 6A, 6B, and 7). Meanwhile, each of the Sdr and the α value was confirmed to be the changing point at the L filter cutoff value of 3.5 µm on the electrode surface of untreated copper foil I (see FIGS. 8A, 8B, and 9). In addition, each of the Sdr and the α value was confirmed to be the changing point at the L filter cutoff value of 3.0 μm on the deposition surface of untreated copper foil II (see FIGS. 10A, 10B, and 11). From the above results, the cutoff value for the L filter was set to 5.0 μm for the deposition surface of untreated copper foil I, to 3.5 μm for the electrode surface of untreated copper foil I, and to 3.0 μm for the deposition surface of untreated copper foil II. Here, the "changing point" herein is the point at which the inclination of the line in the graph showing the relation between cutoff values and a surface parameter (the Sdr and the α value in the present case) significantly changes. Setting the cutoff value to α value smaller than the changing point indicates shifting to a domain in which small irregularities actually present on a surface are averaged (removed). However, since it is difficult to definitely and unambiguously define the "changing point," the "changing point" is a concept allowed to range at a certain level. When the second order differential in the relationship between the cutoff value and a surface parameter is used, accuracy in determination of the "changing point" is enhanced, assisting setting of a more preferable cutoff value. The "changing point" was determined using values obtained by the respective second order differentials of the Sdr and the α value on each of the deposition surface and the electrode surface of untreated copper foil I and the deposition surface of untreated copper foil II in the present examples. A three moving average was used in calculating a second order differential for error reduction.

(4) Surface Treatment of Untreated Copper Foil

As shown in Table 2, four kinds of surface-treated copper foil (copper foil a to copper foil d) differing in surface roughness were produced by subjecting the electrode surface or the deposition surface of untreated copper foil I or II to a surface treatment (roughening treatment) under known conditions. Here, each of copper foil a to copper foil d produced has properties (surface roughness, high frequency characteristics, etc.) similar to those of commercially available products. In addition, untreated copper foil II without any surface treatment was directly used as copper foil e.

(5) Acquisition of Surface Profile of Copper Foil

Surface profiles were acquired by measuring the surface-treated surfaces of copper foil a to copper foil d and the deposition surface of copper foil e using a laser microscope (manufactured by Olympus Corporation, OLS-5000) under conditions of a measurement area of 4,096 μm$^2$ and magnification of 200 times to obtain a surface profile.

(6) Filter Processing and Surface Parameter Calculation

The surface profile of each kind of copper foil was subjected to filter processing. At this time, the cutoff value for the L filter was set to numerical values set in item (3) above, that is, to 5.0 μm for copper foil a and copper foil b, to 3.5 μm for copper foil c, and to 3.0 μm for copper foil d and copper foil e as shown in Table 2. Processing with an S filter was not conducted, and only processing with the L filter was conducted in this filter processing. The Sa, the Sdr, the Vmc, and the Sk were calculated on the basis of the surface profiles after filter processing, and the α value was also calculated. Results are shown in Table 2.

(7) Evaluation of High Frequency Characteristics

A substrate (manufactured by Panasonic Corporation, MEGTRON6N) for high frequencies was provided as an insulating resin substrate. Each surface-treated copper foil was stacked on both sides of the insulating resin substrate such that the surface-treated surface of the surface-treated copper foil abutted on the insulating resin substrate, followed by lamination using a vacuum pressing machine under conditions of a temperature of 190° C. and a pressing time of 120 minutes to obtain a copper-clad laminated sheet with an insulation thickness of 136 μm. Thereafter, the copper-clad laminated sheet was subjected to etching processing to obtain a substrate for transmission loss measurement in which a microstrip line was formed such that characteristic impedance became 50Ω. Transmission loss (dB/cm) at 50 GHz was measured for the obtained substrate for transmission loss measurement using a network analyzer (manufactured by Keysight Technologies, N5225B). Results are shown in Table 2.

(8) Correlation between surface parameter and high frequency characteristics Evaluation results of the respective kinds of copper foil were plotted, with the transmission loss as the horizontal axis and the surface parameter (the Sr or the α value) as the vertical axis. A regression formula was obtained by linear approximation (least-square method) on the basis of these plot data, and a determination coefficient $R^2$ was calculated. As a result, the determination coefficient $R^2$ in the regression formula in the case where the Sdr was adopted in the vertical axis was 0.9202, and the determination coefficient $R^2$ in the regression formula in the case where the α value was adopted in the vertical axis was 0.9363.

TABLE 2

| | Surface treatment | | | | | | | High frequency characteristics |
|---|---|---|---|---|---|---|---|---|
| Untreated copper foil | | | L filter Cutoff | Surface parameter | | | | Transmission |
| Type and thickness | | Treated surface | value (μm) | Sa (μm) | Sdr (%) | Vmc (μm$^3$) | Sk (μm) | α value | loss (dB/cm) |
| Copper foil a | I (35 μm) | Deposition surface | 5.0 | 0.201 | 47.272 | 0.206 | 0.556 | 17.514 | −0.555 |
| Copper foil b | I (18 μm) | Deposition surface | 5.0 | 0.192 | 42.442 | 0.193 | 0.511 | 16.030 | −0.555 |
| Copper foil c | I (18 μm) | Electrode surface | 3.5 | 0.081 | 31.624 | 0.088 | 0.246 | 11.313 | −0.540 |
| Copper foil d | II (18 μm) | Deposition surface | 3.0 | 0.057 | 23.979 | 0.065 | 0.183 | 8.517 | −0.525 |
| Copper foil e | II (18 μm) | Without treatment | 3.0 | 0.009 | 0.487 | 0.010 | 0.027 | 0.180 | −0.515 |

Example A2

Correlation between the surface parameters and high frequency characteristics was checked in the same manner as Example A1 except that the cutoff value for the L filter on the deposition surface and the electrode surface of untreated copper foil I and the deposition surface of untreated copper foil II was set to 5.0 μm, that is, the surface profiles of copper foil a to copper foil e were subjected to filter processing with the cutoff value for the L filter set to 5.0 μm. As a result, the determination coefficient $R^2$ in the regression formula in the case where the Sdr was adopted in the vertical axis was 0.9092, and the determination coefficient $R^2$ in the regression formula in the case where the α value was adopted in the vertical axis was 0.9327. Here, although the changing points of the Sdr and the α value on the electrode surface of untreated copper foil I and the deposition surface of untreated copper foil II were assumed to be 3.5 μm and 3.0 μm, respectively, in Example A1, these values differ from the set cutoff value (5.0 μm) in Example A2. In this regard, the above-mentioned set cutoff value is permissible as a changing point because changes in the Sdr and in the α value are small within the range within which the cutoff value is 3.0 μm or more and 5.0 μm or less as shown in FIGS. 8A, 8B, 10A, and 10B.

Example A3

Correlation between the surface parameters and high frequency characteristics was checked in the same manner as Example A1 except that the cutoff value for the L filter on the deposition surface and the electrode surface of untreated copper foil I and the deposition surface of untreated copper foil II was set to 2.0 μm, that is, the surface profiles of copper foil a to copper foil e were subjected to filter processing with the cutoff value for the L filter set to 2.0 μm in the step of setting the cutoff value for the L filter using untreated copper foil. As a result, the determination coefficient $R^2$ in the regression formula in the case where the Sdr was adopted in the vertical axis was 0.8548, and the determination coefficient $R^2$ in the regression formula in the case where the α value was adopted in the vertical axis was 0.8721. Here, although the changing points of the Sdr and the α value on the deposition surface and the electrode surface of untreated copper foil I and the deposition surface of untreated copper foil II were assumed to be 5.0 μm, 3.5 μm, and 3.0 μm, respectively, in Example A1, these values differ from the set cutoff value (2.0 μm) in Example A3. In this regard, the above-mentioned set cutoff value is permissible as a changing point because changes in the Sdr and in the α value are small within the range within which the cutoff value is 2.0 μm or more and 5.0 μm or less as shown in FIGS. 6A, 6B, 8A, 8B, 10A, and 10B.

Figure 12:
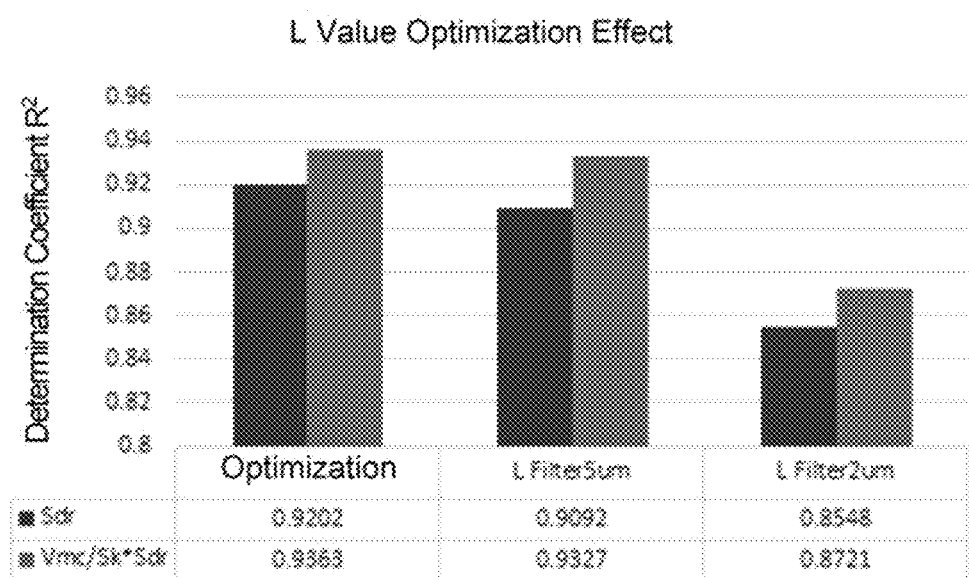
FIG. 12 is a graph comparing determination coefficients $R^2$ of regression formulae of surface parameters of copper foil and transmission loss in Examples A1 to A3.

FIG. 12 is a graph comparing the determination coefficients $R^2$ of regression formulae of the surface parameter (the Sdr or the α value) of copper foil and transmission loss in Examples A1 to A3. As shown in FIG. 12, the correlation between the surface parameters and high frequency characteristics was good in all of Examples A1 to A3. That is, it was confirmed that when the cutoff value for the L filter was preliminarily set using untreated copper foil, surface parameters of copper foil accurately reflected high frequency characteristics. In addition, the results demonstrated that the surface parameters (surface parameters calculated in Example A1) calculated with the cutoff value individually set according to each surface parameter of the untreated copper foil provided better correlation with high frequency characteristics compared with the surface parameters (surface parameters calculated in Examples A2 and A3) calculated with a fixed cutoff value for the L filter.

Examples B1 to B5

It was confirmed that the surface parameters of copper foil more accurately reflected high frequency characteristics when the cutoff value was set to satisfy a predetermined condition in the step of setting the cutoff value for the L filter on the basis of the surface profiles of untreated copper foil. Specifically, see the following.

Example B1

Figure 13:
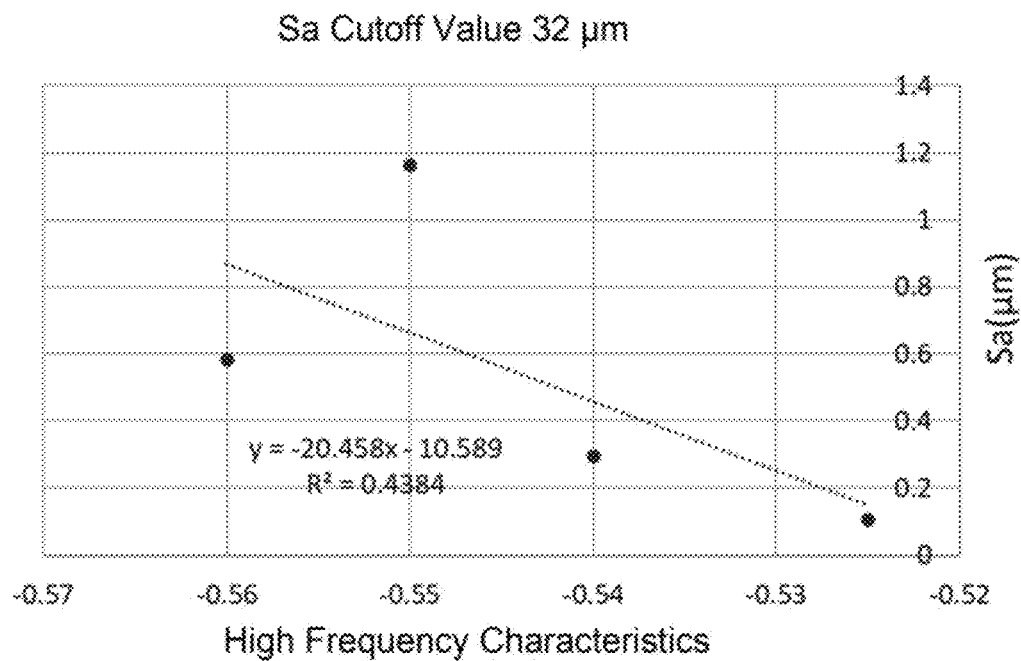
FIG. 13 is a graph showing the correlation between the arithmetical mean heights Sa of copper foil a to copper foil d and high frequency characteristics in Example B1.

(1) Provision of Untreated Copper Foil
Untreated copper foil I and untreated copper foil II were provided as in Example A1.
(2) Acquisition of Surface Profile of Untreated Copper Foil
Surface profiles on the electrode surface and the deposition surface of untreated copper foil I and the deposition surface of untreated copper foil II were acquired in the same manner as Example A1.
(3) Setting of Cutoff Value for L Filter
The Sa, the Sdr, the Vmc, and the Sk were calculated by analyzing each surface profile of the obtained untreated copper foil with the cutoff value for the L filter set to 32 μm. As a result, it was confirmed that the Sa (that is, Sa1) after L filter processing of the deposition surface of untreated copper foil I was α value (=1.16 μm) exceeding 0.5 μm. In addition, the Sdr, the Vmc, and the Sk without cutoff with an L filter were calculated. The α value (=(Vmc/Sk)×Sdr) was calculated on the basis of the calculated Sdr, Vmc, and Sk, and the percent change of Sdr and the percent change of α value before and after L filter processing were calculated. As a result, the percent change of Sdr and the percent change of α value were all 80% or less in untreated copper foil I and untreated copper foil II.
(4) Surface Treatment of Untreated Copper Foil
Four kinds of surface-treated copper foil (copper foil a to copper foil d) differing in surface roughness were produced in the same manner as Example A1.
(5) Acquisition of Surface Profile of Copper Foil
Surface-treated surfaces of copper foil a to copper foil d were measured with a laser microscope in the same manner as Example A1 to obtain surface profiles.
(6) Filter Processing and Surface Parameter Calculation
The surface profile of each kind of copper foil was subjected to filter processing. At this time, the cutoff value for the L filter was set to 32 μm. Processing with an S filter was not conducted, and only processing with the L filter was conducted in this filter processing. The Sa, the Sq, the Sz, the Sdr, the Vmc, and the Sk were calculated on the basis of the surface profile after filter processing, and the α value was also calculated.
(7) Evaluation of High Frequency Characteristics
A substrate for transmission loss measurement was produced using each of copper foil a to copper foil d, and transmission loss at 50 GHz was measured in the same manner as Example A1.
(8) Correlation Between Surface Parameter and High Frequency Characteristics
Evaluation results of the respective kinds of copper foil were plotted, with the transmission loss as the horizontal axis and the surface parameter (the Sa, the Sq, the Sz, the Sdr, the Vmc, the Sk, or the α value) as the vertical axis. A regression formula was obtained by linear approximation (least-square method) on the basis of these plot data, and a determination coefficient $R^2$ was calculated. Results are shown in Table 3. Here, FIG. 13 shows a graph representing the correlation between the Sa of copper foil a to copper foil d and high frequency characteristics.

Example B2

Correlation between the surface parameters and high frequency characteristics was checked in the same manner as Example B1 except that the cutoff value was set to 10 μm in setting the cutoff value for the L filter using untreated copper foil and in L filter processing of the surface profiles of copper foil a to copper foil d. Results are shown in Table 3.

Figure 14:
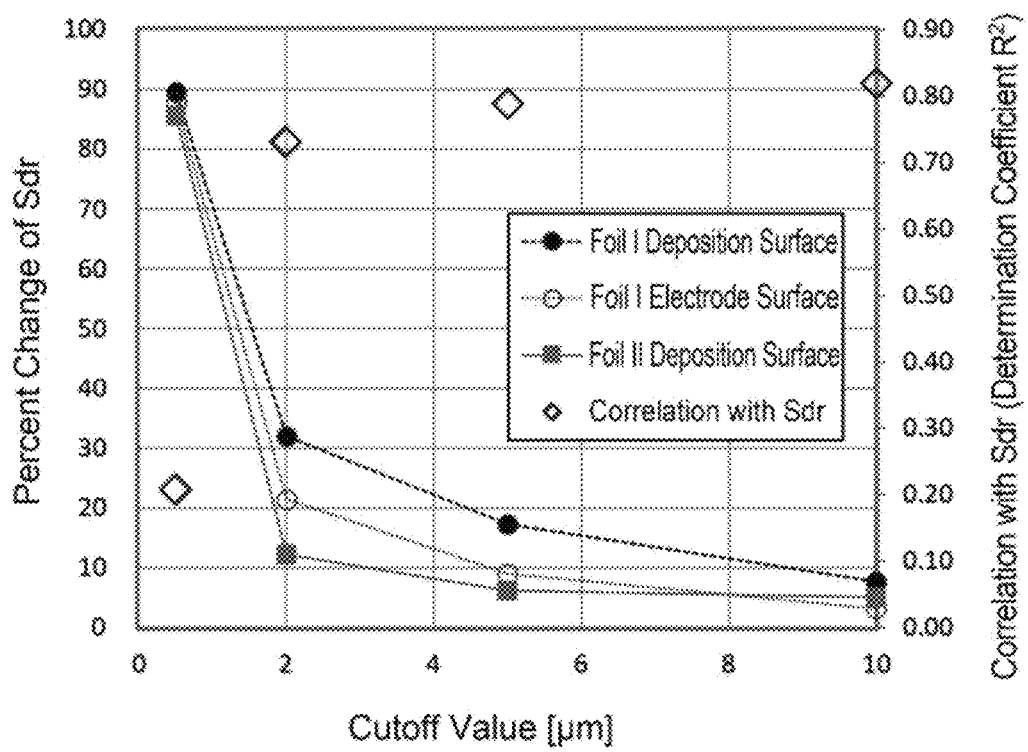
FIG. 14 is a graph showing the correlation (determination coefficients $R^2$) between percent change of Sdr of untreated copper foil I and untreated copper foil II and high frequency characteristics of copper foil a to copper foil d in Examples B2 to B5.
Figure 15:
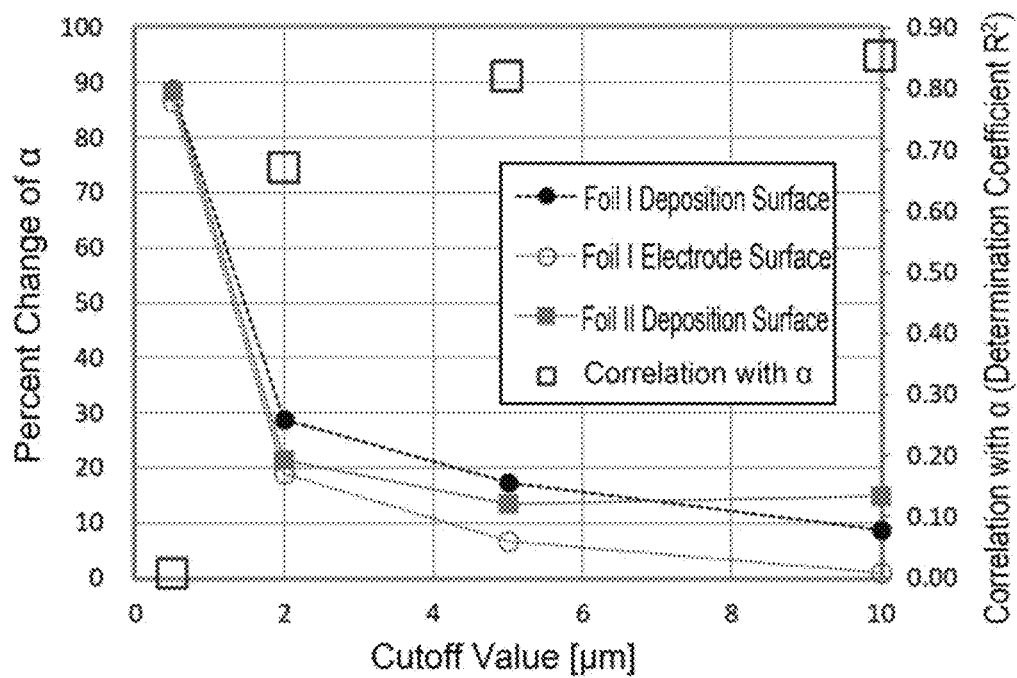
FIG. 15 is a graph showing the correlation (determination coefficients $R^2$) between percent change of a value of untreated copper foil I and untreated copper foil II and high frequency characteristics of copper foil a to copper foil d in Examples B2 to B5.

FIG. 14 shows a graph representing the correlation (determination coefficients $R^2$) between the percent change of Sdr of untreated copper foil I and untreated copper foil II, and high frequency characteristics, and FIG. 15 shows a graph representing the correlation (determination coefficients $R^2$) between the percent change of α value of untreated copper foil I and untreated copper foil II and high frequency characteristics. As shown in FIG. 14 and FIG. 15, the percent change of Sdr and the percent change of α value on the electrode surface and the deposition surface of untreated copper foil I and on the deposition surface of untreated copper foil II were all 80% or less when the cutoff value for the L filter was set to 10 μm. In addition, the Sa values of the electrode surface and the deposition surface of untreated copper foil I and on the deposition surface of untreated copper foil II were all 0.5 μm or less when the cutoff value for the L filter was set to 10 μm.

Example B3

Figure 16:
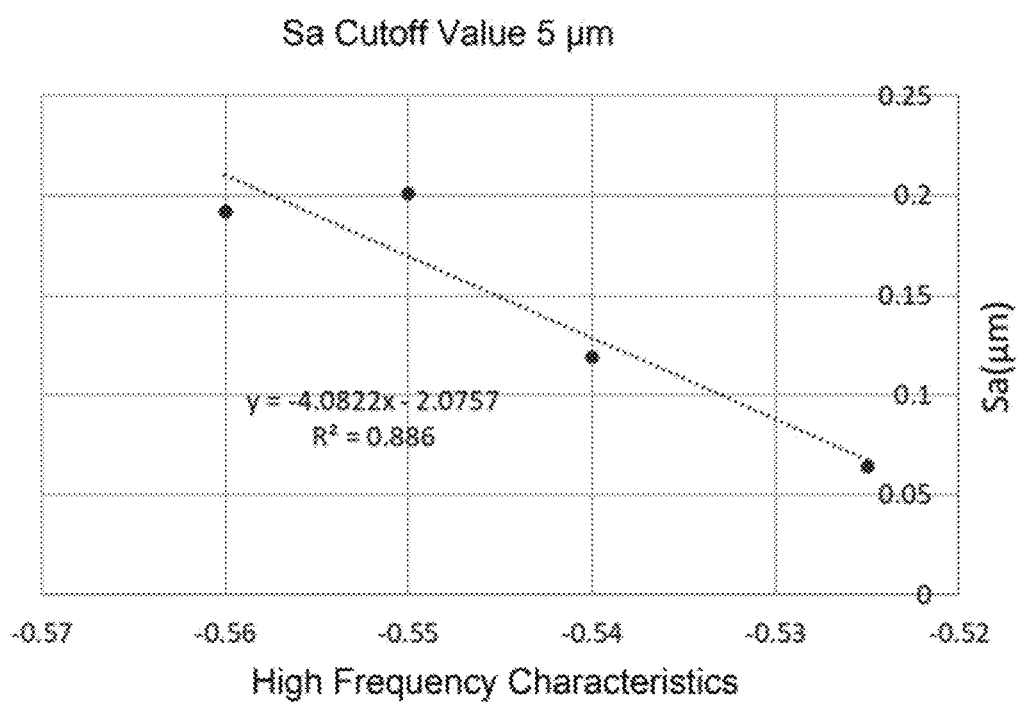
FIG. 16 is a graph showing the correlation between the arithmetical mean heights Sa of copper foil a to copper foil d and high frequency characteristics in Example B3.

Correlation between the surface parameters and high frequency characteristics was checked in the same manner as Example B1 except that the cutoff value was set to 5.0 μm in setting the cutoff value for the L filter using untreated copper foil and in L filter processing of the surface profiles of copper foil a to copper foil d. Results are shown in Table 3. Here, FIG. 16 shows a graph representing the correlation between the Sa of copper foil a to copper foil d and high frequency characteristics.

As shown in FIG. 14 and FIG. 15, the percent change of Sdr and the percent change of α value on the electrode surface and the deposition surface of untreated copper foil I and on the deposition surface of untreated copper foil II were all 80% or less when the cutoff value for the L filter was set to 5.0 μm. In addition, the Sa values of the electrode surface and the deposition surface of untreated copper foil I and on the deposition surface of untreated copper foil II were all 0.5 μm or less when the cutoff value for the L filter was set to 5 μm.

Example B4

Correlation between the surface parameters and high frequency characteristics was checked in the same manner as Example B1 except that the cutoff value was set to 2.0 μm in setting the cutoff value for the L filter using untreated copper foil and in L filter processing of the surface profiles of copper foil a to copper foil d. Results are shown in Table 3.

As shown in FIG. 14 and FIG. 15, the percent change of Sdr and the percent change of α value on the electrode surface and the deposition surface of untreated copper foil I and on the deposition surface of untreated copper foil II were all 80% or less when the cutoff value for the L filter was set to 2.0 μm. In addition, the Sa values of the electrode surface and the deposition surface of untreated copper foil I and on the deposition surface of untreated copper foil II were all 0.5 μm or less when the cutoff value for the L filter was set to 10 μm.

Example B5

Correlation between the surface parameters and high frequency characteristics was checked in the same manner as Example B1 except that the cutoff value was set to 0.5 μm in setting the cutoff value for the L filter using untreated copper foil and in L filter processing of the surface profiles of copper foil a to copper foil d. Results are shown in Table 3.

As shown in FIG. 14 and FIG. 15, the percent change of Sdr and the percent change of α value on the electrode surface and the deposition surface of untreated copper foil I and on the deposition surface of untreated copper foil II all exceeded 80% when the cutoff value for the L filter was set to 0.5 μm. In addition, the Sa values of the electrode surface and the deposition surface of untreated copper foil I and on the deposition surface of untreated copper foil II were all 0.5 μm or less when the cutoff value for the L filter was set to 0.5 μm.

TABLE 3

|  | L filter Cutoff value | Correlation between surface parameter and high frequency characteristics (determination coefficient $R^2$) | | | | | | |
| --- | --- | --- | --- | --- | --- | --- | --- | --- |
|  | (μm) | Sa | Sq | Sz | Sdr | Vmc | Sk | α value |
| Example B1 | 32 | 0.4384 | 0.4684 | 0.5098 | 0.7740 | 0.4103 | 0.3840 | 0.8417 |
| Example B2 | 10 | 0.8365 | 0.8300 | 0.5975 | 0.8183 | 0.8080 | 0.7873 | 0.8524 |
| Example B3 | 5.0 | 0.8860 | 0.8824 | 0.5482 | 0.7890 | 0.8728 | 0.8533 | 0.8183 |
| Example B4 | 2.0 | 0.8388 | 0.7955 | 0.7114 | 0.7316 | 0.8741 | 0.9283 | 0.6701 |
| Example B5 | 0.5 | 0.3988 | 0.5400 | 0.6141 | 0.2075 | 0.3747 | 0.5051 | 0.0054 |

The invention claimed is:

1. A method for measuring a surface parameter of copper foil, comprising the steps of:

(a) acquiring a surface profile on at least one surface of an untreated copper foil;

(b) setting a cutoff value for an L filter based on the surface profile;

(c) acquiring a surface profile on at least one surface of a surface-treated copper foil originating from the untreated copper foil;

(d) subjecting the surface profile of the surface-treated copper foil to filter processing, the filter processing including processing using an L filter with the cutoff value; and (e) calculating at least one of surface parameters defined by ISO 25178 on the surface of the surface-treated copper foil based on the surface profile after the filter processing.

2. The method for measuring a surface parameter of copper foil according to claim 1,
wherein, in the step (d), the filter processing is conducted without using an S filter.

3. The method for measuring a surface parameter of copper foil according to claim 1,
wherein, in the step (b), the cutoff value for the L filter is set so as to satisfy:
(i) Sa1, which is an arithmetical mean height Sa after processing with the L filter, being 0.5 μm or less, and
(ii) a percent change of developed interfacial area ratio Sdr before and after processing with the L filter being 80% or less, the percent change of Sdr being represented by a formula (|Sdr0−Sdr1|/Sdr0)×100, wherein Sdr0 is an Sdr before processing with the L filter, and Sdr1 is an Sdr after processing with the L filter; and
the Sa and the Sdr are surface parameters defined by ISO 25178.

4. The method for measuring a surface parameter of copper foil according to claim 3,
wherein the Sa1 is 0.3 μm or less, and the percent change of Sdr is 70% or less.

5. The method for measuring a surface parameter of copper foil according to claim 1,
wherein, in the step (b), the cutoff value for the L filter is set, so as to satisfy:
(i) Sa1, which is an arithmetical mean height Sa after processing with the L filter, being 0.5 μm or less, and
(ii') a percent change of a value before and after processing with the L filter being 80% or less, the percent change of a value being represented by a formula (|α0−α1|/α0)×100, wherein α0 is an α value before processing with the L filter, and α1 is an α value after processing with the L filter;
the α value is obtained by dividing a core material volume Vmc by a core height Sk to obtain a quotient and multiplying the quotient by a developed interfacial area ratio Sdr, that is, obtained by a formula (Vmc/Sk)×Sdr; and
the Sa, the Sdr, the Vmc and the Sk are surface parameters defined by ISO 25178.

6. The method for measuring a surface parameter of copper foil according to claim 5,
wherein the Sa1 is 0.3 μm or less, and the percent change of a value is 70% or less.

7. A method for selecting copper foil, comprising the steps of:
measuring a surface parameter of copper foil using the method according to claim 1, wherein the surface parameter is at least one selected from the group consisting of an arithmetical mean height Sa, a root mean square height Sq, a maximum height Sz, a developed interfacial area ratio Sdr, a core material volume Vmc, and a core height Sk defined by ISO 25178; and
selecting, as a copper foil suitable for a printed-wiring board for high frequency application, a copper foil having a surface in which the Sa is 1.2 μm or less, the Sq is 2.5 μm or less, the Sz is 14 μm or less, the Sdr is 60% or less, the Vmc is 1.5 μm$^3$ or less, and/or the Sk is 4 μm or less.

8. A method for producing surface-treated copper foil, comprising the steps of:
providing an untreated copper foil;
subjecting, to a surface treatment, at least one surface of the untreated copper foil to produce a surface-treated copper foil;
measuring a surface parameter of the surface-treated copper foil using the method according to claim 1; and
submitting the surface-treated copper foil for shipping or recognizing the surface-treated copper foil as one to be shipped only when the surface parameter satisfies a predetermined condition, wherein
at least one surface of the untreated copper foil is subjected to acquisition of the surface profile in the step (a), and
the surface subjected to the surface treatment of the surface-treated copper foil is subjected to acquisition of the surface profile in the step (c).

9. The method for producing surface-treated copper foil according to claim 8,
wherein the surface-treated copper foil is used for a printed-wiring board for high frequency application of 1 GHz or more.

10. A method for producing a printed-wiring board for high frequency application, comprising the step of:
producing a printed-wiring board for high frequency application using a copper foil obtained by the method according to claim 7.

* * * * *